United States Patent
Zomorodi Moghadam et al.

(10) Patent No.: US 12,157,393 B2
(45) Date of Patent: Dec. 3, 2024

(54) SYSTEM AND METHOD FOR OPERATING VEHICLE BASED ON BATTERY HEALTH

(71) Applicant: FORD GLOBAL TECHNOLOGIES, LLC, Dearborn, MI (US)

(72) Inventors: Hesam Zomorodi Moghadam, Ypsilanti, MI (US); Rui Wang, Canton, MI (US); Xu Wang, Northville, MI (US); Andrea Cordoba Arenas, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 525 days.

(21) Appl. No.: 17/513,781

(22) Filed: Oct. 28, 2021

(65) Prior Publication Data
US 2023/0132798 A1 May 4, 2023

(51) Int. Cl.
*B60L 58/12* (2019.01)
*B60L 3/12* (2006.01)
*B60L 58/10* (2019.01)
*B60L 58/16* (2019.01)
*G01R 31/382* (2019.01)
(Continued)

(52) U.S. Cl.
CPC ............ *B60L 58/12* (2019.02); *B60L 3/12* (2013.01); *B60L 58/10* (2019.02); *B60L 58/16* (2019.02); *G01R 31/382* (2019.01); *G01R 31/396* (2019.01); *H02J 7/00032* (2020.01); *H02J 7/0047* (2013.01); *H02J 7/007* (2013.01); *H02J 7/0071* (2020.01); *H02J 7/007188* (2020.01); *H02J 7/007192* (2020.01); *B60L 2260/50* (2013.01); *G01R 31/367* (2019.01); *G01R 31/374* (2019.01); *G01R 31/378* (2019.01); *H02J 7/0048* (2020.01)

(58) Field of Classification Search
CPC .......... B60L 58/12; B60L 58/10; B60L 58/16; B60L 3/12; B60L 2260/50; G01R 31/382; G01R 31/396; G01R 31/367; G01R 31/374; G01R 31/378; H02J 7/00032; H02J 7/0047; H02J 7/007; H02J 7/0071; H02J 7/007188; H02J 7/007192; H02J 7/0048
USPC ........................................................ 320/136
See application file for complete search history.

(56) References Cited

U.S. PATENT DOCUMENTS

| | | | |
|---|---|---|---|
| 10,277,041 B2 | 4/2019 | Zane et al. | |
| 2010/0121588 A1* | 5/2010 | Elder | B60L 58/16 702/85 |

(Continued)

FOREIGN PATENT DOCUMENTS

| CN | 107003357 A | * 8/2017 | .............. B60L 50/66 |
|---|---|---|---|
| CN | 109061504 A | 12/2018 | |
| WO | WO-2019184850 A1 | * 10/2019 | |

*Primary Examiner* — Richard Isla
*Assistant Examiner* — Manuel Hernandez
(74) *Attorney, Agent, or Firm* — David B. Kelley; Brooks Kushman P.C.

(57) ABSTRACT

A vehicle battery system includes a battery, storage, and one or more controllers. The storage maintains data defining power outputs for the battery at a plurality of predefined combinations of temperature and state of charge. The one or more controllers repeatedly update the data for some of the plurality based on temperatures and states of charge repeatedly encountered by the vehicle, update the data for other of the plurality based on data from a remote server, and discharge the battery according to the data for the some and other of the plurality.

18 Claims, 6 Drawing Sheets

(51) Int. Cl.
*G01R 31/396* (2019.01)
*H02J 7/00* (2006.01)
*G01R 31/367* (2019.01)
*G01R 31/374* (2019.01)
*G01R 31/378* (2019.01)

(56) References Cited

U.S. PATENT DOCUMENTS

| | | | |
|---|---|---|---|
| 2014/0089692 A1* | 3/2014 | Hanafusa | H02J 13/00022 |
| | | | 713/310 |
| 2015/0251556 A1* | 9/2015 | Meyer | B60K 6/442 |
| | | | 701/22 |
| 2015/0326038 A1* | 11/2015 | Lee | H02J 7/00302 |
| | | | 320/134 |
| 2018/0083461 A1* | 3/2018 | Ravi | G06F 1/28 |
| 2018/0095140 A1* | 4/2018 | Park | G01R 31/367 |
| 2019/0278581 A1* | 9/2019 | Miller | G06F 8/65 |
| 2019/0315237 A1* | 10/2019 | Trnka | B60L 3/12 |
| 2019/0353710 A1* | 11/2019 | Rocci | G01R 31/3648 |
| 2020/0070684 A1* | 3/2020 | Maruno | B60L 58/12 |
| 2020/0164763 A1 | 5/2020 | Holme | |
| 2020/0269722 A1* | 8/2020 | Aykol | G05B 13/0265 |
| 2020/0271725 A1* | 8/2020 | Herring | G01R 31/396 |
| 2020/0348923 A1* | 11/2020 | Mezaael | G06N 5/04 |
| 2020/0386819 A1 | 12/2020 | Lee et al. | |
| 2022/0080855 A1* | 3/2022 | Trnka | B60L 3/12 |
| 2022/0187374 A1* | 6/2022 | Zhang | B60L 3/12 |
| 2023/0068432 A1* | 3/2023 | Upadhyay | G07C 5/0808 |
| 2023/0133120 A1* | 5/2023 | Jang | G07C 5/0808 |
| | | | 702/63 |
| 2024/0003981 A1* | 1/2024 | Singh | G01R 31/392 |

\* cited by examiner

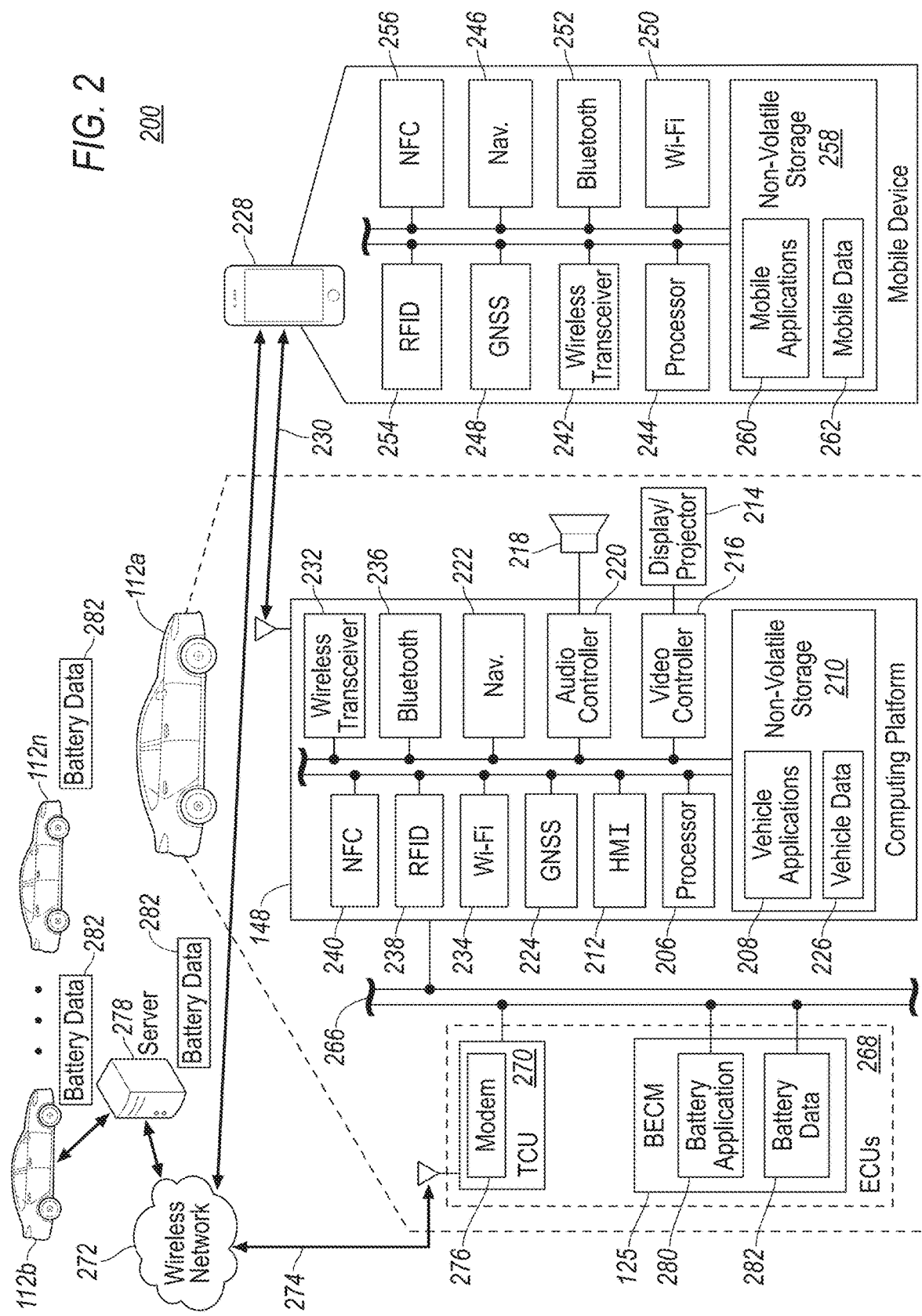

| Current SOH 87% | SOC (%) | | | | | | |
|---|---|---|---|---|---|---|---|
| | 0 | 10 | 30 | 50 | 80 | 90 | 100 |
| temperature (deg C) -40 | 0.5 | 0.5 | 10.7 | 26.6 | 43.0 | 49.8 | 57.4 |
| -20 | 16.1 | 27.5 | 58.9 | 143.7 | 207.2 | 237.8 | 259.5 |
| 0 | 18.3 | 41.7 | 177.1 | 350.8 | 392.7 | 407.1 | 433.2 |
| 20 | 38.8 | 102.4 | 379.5 | 420.8 | 449.7 | 460.6 | 477.9 |
| 30 | 70.1 | 187.8 | 401.5 | 434.3 | 463.0 | 474.5 | 477.9 |
| 40 | 118.2 | 312.2 | 416.5 | 443.1 | 471.2 | 477.9 | 477.9 |
| 60 | 132.4 | 200.6 | 325.0 | 365.9 | 388.0 | 396.9 | 426.2 |

MPC Lookup Table (kW)

| Current SOH 87% | SOC (%) | | | | | | | | | |
|---|---|---|---|---|---|---|---|---|---|---|
| | 0-10% | 10-20% | 20-30% | 30-40% | 40-50% | 50-60% | 60-70% | 70-80% | 80-90% | 90-100% |
| temperature (deg C) -40 | 2.29 | 2.86 | 3.29 | 3.65 | 3.99 | 4.35 | 4.76 | 5.18 | 5.62 | 6.09 |
| -20 | 5.64 | 6.13 | 6.48 | 6.73 | 6.94 | 7.20 | 7.52 | 7.84 | 8.18 | 8.55 |
| 0 | 7.24 | 7.70 | 8.06 | 8.34 | 8.57 | 8.87 | 9.26 | 9.65 | 10.06 | 10.52 |
| 20 | 8.78 | 9.25 | 9.60 | 9.85 | 10.06 | 10.35 | 10.57 | 10.96 | 11.37 | 11.82 |
| 40 | 9.84 | 10.24 | 10.51 | 10.67 | 10.77 | 10.96 | 11.26 | 11.54 | 11.85 | 12.20 |
| 60 | 10.06 | 10.46 | 10.73 | 10.89 | 11.00 | 11.20 | 11.49 | 11.79 | 12.10 | 12.45 |

MESC Lookup Table (kWh)

| Current SOH | Voltage | | | |
|---|---|---|---|---|
| | V1 | V2 | V3 | ... |
| Temperature T1 | P1,1 | P1,2 | P1,3 | ... |
| T2 | P2,1 | P2,2 | P2,3 | ... |
| T3 | P3,1 | P3,2 | P3,3 | ... |
| ... | ... | ... | ... | ... |

Power Output Lookup Table
310

FIG. 3C

| Current SOH | Voltage | | | |
|---|---|---|---|---|
| | V1 | V2 | V3 | ... |
| Temperature T1 | E1,1 | E1,2 | E1,3 | ... |
| T2 | E2,1 | E2,2 | E2,3 | ... |
| T3 | E3,1 | E3,2 | E3,3 | ... |
| ... | ... | ... | ... | ... |

Energy Storage Amount Lookup Table
312

FIG. 3D

SYSTEM AND METHOD FOR OPERATING VEHICLE BASED ON BATTERY HEALTH

TECHNICAL FIELD

The present disclosure relates to a system and method for managing battery state of health of an electric vehicle.

BACKGROUND

Electrified vehicles are propelled by a high-voltage (HV) battery which are commonly made of lithium-ion batteries. As the lithium-ion batteries age, a number of battery characteristics such as energy storage capacity, maximum charge/discharge power capability, and internal resistance may change.

SUMMARY

A vehicle battery system includes a battery, storage, and one or more controllers. The storage maintains data defining power outputs for the battery at a plurality of predefined combinations of temperature and state of charge. The one or more controllers repeatedly update the data for some of the plurality based on temperatures and states of charge repeatedly encountered by the vehicle, update the data for other of the plurality based on data from a remote server that was generated by other vehicles after repeatedly encountering the predefined combinations of temperature and state of charge corresponding to the other of the plurality, and discharge the battery according to the data for the some and other of the plurality.

A method includes maintaining data defining energy storage amounts for a battery of a vehicle at a plurality of predefined combinations of temperature and voltage, repeatedly updating the data for some of the plurality based on temperatures and voltages repeatedly encountered by the vehicle, updating the data for other of the plurality based on data from a remote server that was generated by other vehicles after repeatedly encountering the predefined combinations of temperature and voltage corresponding to the other of the plurality, and operating the battery according to the data for the some and other of the plurality.

A vehicle system includes one or more controllers that repeatedly update the data defining power outputs for a battery of a vehicle at a plurality of predefined combinations of temperature and voltage for some of the plurality based on temperatures and voltages repeatedly encountered by the vehicle, update the data for other of the plurality based on data from a remote server, and discharge the battery according to the data for the some and other of the plurality.

BRIEF DESCRIPTION OF THE DRAWINGS

FIG. 2 is an example block topology of a vehicle system.

FIG. 3A is an example maximum power capability lookup table.

FIG. 3B is an example maximum energy storage capacity lookup table.

FIG. 3C is an example power output lookup table at predefined combinations of temperature and voltage.

FIG. 3D is an example energy storage amount lookup table at predefined combinations of temperature and voltage.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

The present disclosure, among other things, proposes a system and method for managing battery health for an electric vehicle. More specifically, the present disclosure proposes a system and method for managing battery health for an electric vehicle using a cloud infrastructure.

Figure 1:
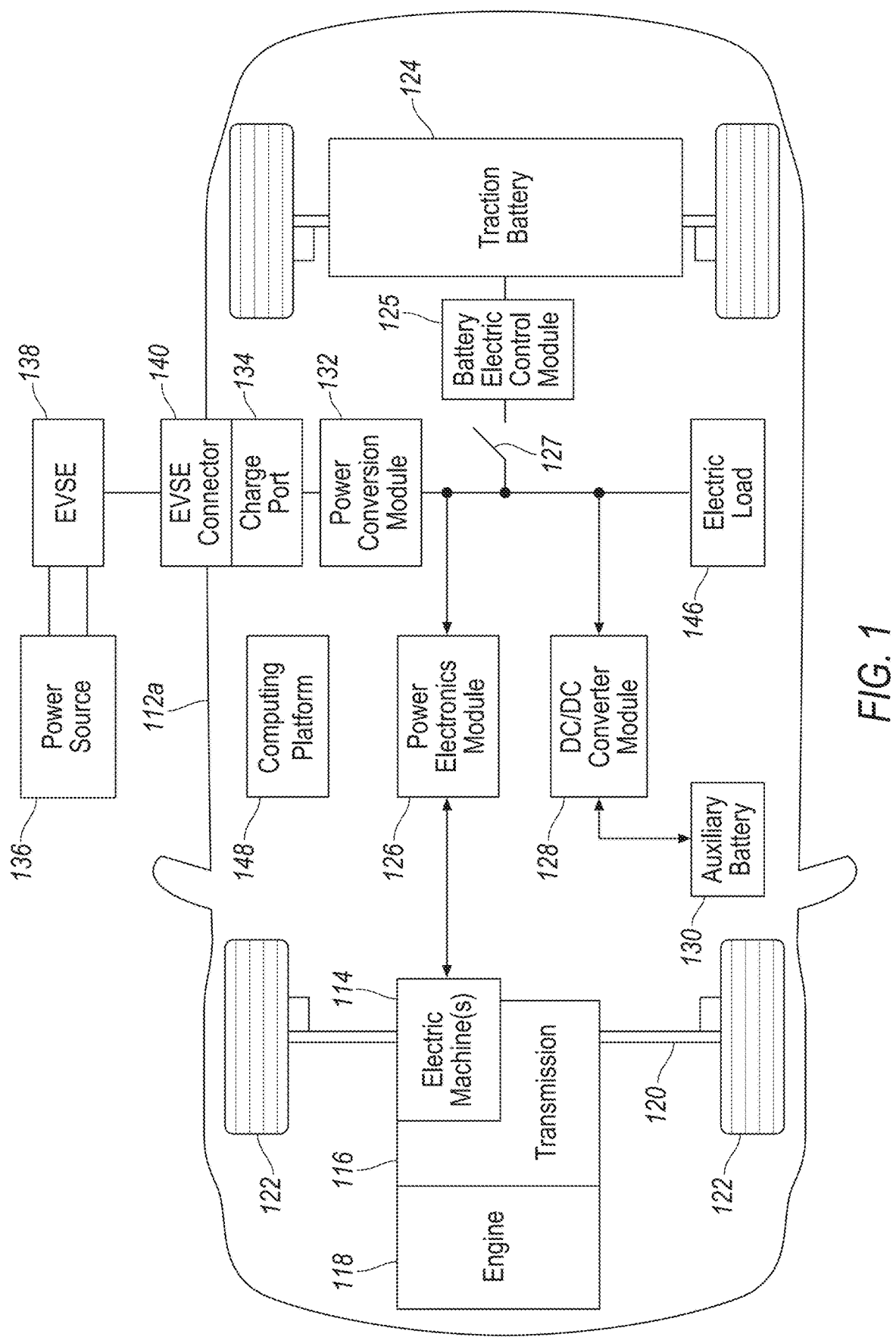
FIG. 1 is an example block topology of a hybrid vehicle illustrating drivetrain and energy storage components.

FIG. 1 illustrates a plug-in hybrid-electric vehicle (PHEV). A plug-in hybrid-electric vehicle 112a may comprise one or more electric machines (electric motors) 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 may provide propulsion and slowing capability when the engine 118 is turned on or off. The electric machines 114 may also act as generators and may provide fuel economy benefits by recovering energy that would be lost as heat in the friction braking system. The electric machines 114 may also reduce vehicle emissions by allowing the engine 118 to operate at more efficient speeds and allowing the hybrid-electric vehicle 112a to be operated in electric mode with the engine 118 off under certain conditions.

A traction battery or battery pack 124 stores energy that may be used by the electric machines 114. A vehicle battery pack 124 may provide a high voltage DC output. The traction battery 124 may be electrically coupled to one or more battery electric control modules (BECM) 125. The BECM 125 may be provided with one or more processors and software applications configured to monitor and control various operations of the traction battery 124. The traction battery 124 may be further electrically coupled to one or more power electronics modules 126. The power electronics module 126 may also be referred to as a power inverter. One or more contactors 127 may isolate the traction battery 124 and the BECM 125 from other components when opened and couple the traction battery 124 and the BECM 125 to other components when closed. The power electronics module 126 may also be electrically coupled to the electric machines 114 and provide the ability to bi-directionally transfer energy between the traction battery 124 and the electric machines 114. For example, a traction battery 124 may provide a DC voltage while the electric machines 114 may operate using a three-phase AC current. The power electronics module 126 may convert the DC voltage to a three-phase AC current for use by the electric machines 114. In a regenerative mode, the power electronics module 126 may convert the three-phase AC current from the electric machines 114 acting as generators to the DC voltage compatible with the traction battery 124. The description herein is equally applicable to a pure electric vehicle. For a pure electric vehicle, the hybrid transmission 116 may be a gear box connected to an electric machine 114 and the engine 118 may not be present.

In addition to providing energy for propulsion, the traction battery 124 may provide energy for other vehicle electrical systems. A vehicle may include a DC/DC converter module 128 that converts the high voltage DC output of the traction battery 124 to a low voltage DC supply that is compatible with other low-voltage vehicle loads. An output of the DC/DC converter module 128 may be electrically coupled to an auxiliary battery 130 (e.g., 12V battery). Other high-voltage loads 146, such as compressors and electric heaters, may be coupled to the high-voltage output of the traction batter 124.

The vehicle 112a may be an electric vehicle or a plug-in hybrid vehicle in which the traction battery 124 may be recharged by an external power source 136. The external power source 136 may be a connection to an electrical outlet. The external power source 136 may be an electrical power distribution network or grid as provided by an electric utility company. The external power source 136 may be electrically coupled to electric vehicle supply equipment (EVSE) 138. The EVSE 138 may provide circuitry and controls to manage the transfer of energy between the power source 136 and the vehicle 112a. The external power source 136 may provide DC or AC electric power to the EVSE 138. The EVSE 138 may have a charge connector 140 for plugging into a charge port 134 of the vehicle 112a. The charge port 134 may be any type of port configured to transfer power from the EVSE 138 to the vehicle 112a. The charge port 134 may be electrically coupled to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112a. The EVSE connector 140 may have pins that mate with corresponding recesses of the charge port 134. Alternatively, various components described as being electrically coupled may transfer power using a wireless inductive coupling.

One or more electrical loads 146 may be coupled to the high-voltage bus powered by the traction battery 124. The electrical loads 146 may have an associated controller that operates and controls the electrical loads 146 when appropriate. Examples of electrical loads 146 may be a heating module or an air-conditioning module. The usage of the electrical loads 146 may affect the discharge of the traction battery 124. For instance, vehicles located in hot climates may use air-conditioning modules more often drawing more discharge power from the traction battery 124.

The various components discussed may have one or more associated controllers to control and monitor the operation of the components. The controllers may communicate via a serial bus (e.g., Controller Area Network (CAN)) or via discrete conductors. A computing platform 148 may be present to coordinate the operation of the various components.

Referring to FIG. 2, an example block topology of a vehicle system 200 is illustrated. As an example, the system 200 may include the SYNC system manufactured by The Ford Motor Company of Dearborn, Michigan. It should be noted that the illustrated system 200 is merely an example, and more, fewer, and/or differently located elements may be used.

As illustrated in FIG. 2, the computing platform 148 may include one or more processors 206 configured to perform instructions, commands, and other routines in support of the processes described herein. For instance, the computing platform 148 may be configured to execute instructions 208 of vehicle 112a to provide features such as navigation, remote controls, and wireless communications applications. Such instructions and other data may be maintained in a non-volatile manner using a variety of types of computer-readable storage medium 210. The computer-readable medium 210 (also referred to as a processor-readable medium or storage) includes any non-transitory medium (e.g., tangible medium) that participates in providing instructions or other data that may be read by the processor 206 of the computing platform 148. Computer-executable instructions may be compiled or interpreted from computer programs created using a variety of programming languages and/or technologies, including, without limitation, and either alone or in combination, Java, C, C++, C#, Objective C, Fortran, Pascal, Java Script, Python, Perl, and SQL.

The computing platform 148 may be provided with various features allowing the vehicle occupants/users to interface with the computing platform 148. For example, the computing platform 148 may receive input from HMI controls 212 configured to provide for occupant interaction with the vehicle 112a. As an example, the computing platform 148 may interface with one or more buttons, switches, knobs, or other HMI controls configured to invoke functions on the computing platform 148 (e.g., steering wheel audio buttons, a push-to-talk button, instrument panel controls, etc.).

The computing platform 148 may also drive or otherwise communicate with one or more displays 214 configured to provide visual output to vehicle occupants by way of a video controller 216. In some cases, the display 214 may be a touch screen further configured to receive user touch input via the video controller 216, while in other cases the display 214 may be a display only, without touch input capabilities. The computing platform 148 may also drive or otherwise communicate with one or more speakers 218 configured to provide audio output and input to vehicle occupants by way of an audio controller 220.

The computing platform 148 may also be provided with navigation and route planning features through a navigation controller 222 configured to calculate navigation routes responsive to user input via, for example, the HMI controls 212, and output planned routes and instructions via the speaker 218 and the display 214. Location data that is needed for navigation may be collected from a global navigation satellite system (GNSS) controller 224 configured to communicate with multiple satellites and calculate the location of the vehicle 112a. The GNSS controller 224 may be configured to support various current and/or future global or regional location systems such as global positioning system (GPS), Galileo, Beidou, Global Navigation Satellite System (GLONASS) and the like. Map data used for route planning may be stored in the storage 210 as a part of the vehicle data 226. Navigation software may be stored in the storage 210 as one the vehicle applications 208.

The computing platform 148 may be configured to wirelessly communicate with a mobile device 228 of the vehicle users/occupants via a wireless connection 230. The mobile device 228 may be any of various types of portable computing devices, such as cellular phones, tablet computers, wearable devices, smart watches, smart fobs, laptop computers, portable music players, or other devices capable of communication with the computing platform 148. A wireless transceiver 232 may be in communication with a Wi-Fi controller 234, a Bluetooth controller 236, a radio-frequency identification (RFID) controller 238, a near-field communication (NFC) controller 240, and other controllers such as a Zigbee transceiver, an IrDA transceiver, an ultra-wide band (UWB) controller (not shown), and be configured to communicate with a compatible wireless transceiver 242 of the mobile device 228.

The mobile device 228 may be provided with a processor 244 configured to perform instructions, commands, and other routines in support of the processes such as navigation, telephone, wireless communication, and multi-media processing. For instance, the mobile device 228 may be provided with location and navigation functions via a navigation controller 246 and a GNSS controller 248. The mobile device 228 may be provided with the wireless transceiver 242 in communication with a Wi-Fi controller 250, a Bluetooth controller 252, a RFID controller 254, an NFC controller 256, and other controllers (not shown), configured to communicate with the wireless transceiver 232 of the computing platform 148. The mobile device 228 may be further provided with a non-volatile storage 258 to store various mobile application 260 and mobile data 262.

The computing platform 148 may be further configured to communicate with various components of the vehicle 112a via one or more in-vehicle networks 266. The in-vehicle network 266 may include, but is not limited to, one or more of a controller area network (CAN), an Ethernet network, and a media-oriented system transport (MOST), as some examples. Furthermore, the in-vehicle network 266, or portions of the in-vehicle network 266, may be a wireless network accomplished via Bluetooth low-energy (BLE), Wi-Fi, UWB, or the like.

The computing platform 148 may be configured to communicate with various electronic control units (ECUs) 268 of the vehicle 112a configured to perform various operations. As a few non-limiting examples, the computing platform 148 may be further configured to communicate with a TCU 270 configured to control telecommunication between vehicle 112a and a wireless network 272 through a wireless connection 274 using a modem 276. The wireless connection 274 may be in the form of various communication networks, for example, a cellular network. Through the wireless network 272, the vehicle may access one or more servers 278 to access various content for various purposes. It is noted that the terms wireless network and server are used as general terms in the present disclosure and may include any computing network involving carriers, router, computers, controllers, circuitry or the like configured to store data and perform data processing functions and facilitate communication between various entities. As discussed above, the computing platform 148 may be configured to communicate with the BECM 125 configured to monitor and control the operations of the traction battery 124. The BECM 125 may be provided with data processing and storage capabilities. For instance, a processor (not shown) of the BECM 125 may be configured to execute instructions of one or more battery applications 280 stored in a non-volatile storage (not shown). The BECM 125 may be configured to analyze and record various conditions and parameters of the traction battery 124 and store the conditions and parameters as battery data 282. As a few non-limiting examples, battery data 282 may include a known maximum power capability (MPC) of the battery pack 124 in different temperatures and states of charge (SOC) corresponding to a current state of health (SOH) of the battery pack 124 that prevents accelerated aging of the battery. There are a variety of implementations in which the MPC may be stored and updated. In the present example, the MPC may be stored as a lookup table (LUT) for the BECM 125 to refer to during operation the battery 124. The battery data 282 may further include a LUT for a maximum energy storage capacity (MESC) per specific amount of SOC at different temperatures and SOCs corresponding to a current SOH of the battery pack 124. As a non-limiting example, the specification amount of SOC may be 10% in the present example. The MESC may be used to estimate the distance to empty, amount of charge needed at charging, and time to fully charge for the traction battery 124. The battery data 282 of the vehicle 112a may be further sent to the server 278 for storage and processing via the wireless network. The server 278 may be configured to collect and analyze battery data 282 from a plurality of vehicles such as fleet vehicles 112b ... 112n to collectively analyze and update battery parameters such as the MPC and MESC. Using the battery data 282 collected from the plurality of vehicles, the server 278 may generate and maintain one or more collective lookup tables such that updated data entries in the tables may be shared.

FIG. 3A illustrates an example MPC lookup table 300 and FIG. 3B illustrates an example MESC lookup table 302 of one embodiment of the present disclosure. With continuing reference to FIGS. 1 and 2, the lookup tables 300 and 302 may be stored in the BECM 125 as a part of the battery data 282 for the vehicle 112a. Additionally or alternatively, the lookup tables 300 and 302 may be uploaded and stored in the server 278 for collective management. Referring to FIG. 3A, the MPC lookup table illustrates at a current SOH of 87% the maximum power in kilowatts that the BECM 125 is allowed to discharge the battery 124 in different temperatures and SOC to prevent accelerated aging of the battery. The maximum discharge power may vary significantly by the SOC and temperature of the traction battery 124. For instance, the traction battery 124 has only 0.5 kW for maximum discharge power at 0% SOC and −40° C. temperature, but 477.9 kW for maximum discharge power at 100% SOC and 40° C. temperature. Similarly, the MESC lookup table 302 in FIG. 3B illustrates the maximum energy storage capacity in kilowatt-hours per 10% SOC at different temperatures and SOCs that the traction battery 124 may store for use by the BECM 125 to estimate distance to empty, required charging amount, or the like. The MESC may vary significantly by the SOC and temperature of the traction battery 124. For instance, the traction battery 124 may store only 2.29 kWh of electric energy at 0-10% SOC and −40° C., and may store 12.45 kWh of electric energy at 90-100% SOC and 40° C. It is noted that the numbers illustrated in FIGS. 3A and 3B are merely examples and the present invention is not limited thereto.

A default MPC lookup table 300 and default MESC lookup table 302 may be stored in the BECM 125 as a part of the battery data 282 when the vehicle 112a and/or the battery 124 is manufactured. The BECM 125 may be configured to update the default tables as the battery 124 ages to adjust control strategies accordingly. For instance, the aging of the battery 124 may change the MPC across different SOCs and temperatures. The BECM 125 may need accurate updates to the MPC lookup table 300 to prevent the battery 124 from supplying a power amount that could lead to accelerated aging of the battery and/or the circuit. The BECM 125 may be configured to estimate the updated MPC based on an equivalent circuit model of the battery. However, for the BECM 125 to be able to accurately estimate the battery parameters (e.g. resistance, capacitance, or the like) at each temperature and SOC point, a sufficiently dynamic drive at the temperature and SOC point may be required. However, due to the driving and charging conditions of each specific vehicle, the vehicle may not reach each operating point regularly which prevents the BECM 125 from collecting accurate parameters to make an accurate estimation. For instance, if the vehicle 112a primarily operates in a hot climate and keeps at the higher end of the charge capacity, the BECM 125 may be only able to update the MPC lookup table 300 within a frequent operating region 304 for the higher temperature and higher SOC, and be unable to accurately estimate data outside the frequent operating region 304 due to the lack of required data. Similarly, updates to the MESC lookup table 302 at different temperatures may be estimated as the battery 124 is charged/discharged across the full range of charge at different temperatures. If a vehicle is never/rarely allowed to reach bottom or top of charge at certain temperatures, the estimated MESC may not be accurate. In the present example, since the vehicle 112a rarely reaches the bottom of the charge, the BECM 125 may only estimate accurate MESC updates within the frequent operating region 304 in the MESC lookup table 302. In case that the vehicle 112a operates beyond the frequent operating region 304, the BECM 125 may not have accurate data in the lookup tables 300 and 302 to efficiently control the operations of the battery 124.

The present disclosure proposes a cloud-based system configured to collectively manage the battery data 282 and address the above-mentioned challenges. The server 278 may be configured to collect battery data 282 from various vehicles 112 and construct one or more collective lookup tables for parameters such as the MPC and MESC at different stages of battery life or SOH for vehicles using the same battery cell type. The SOH may be a parameter in percentage form reflecting a general health condition of the traction battery 124. The BECM 125 may be configured to calculate the SOH of the traction battery 124 using various factors including, but not limited to, battery capacity, internal resistance, internal capacitance, or the like.

FIG. 3C illustrates an example power output lookup table 310 at predefined combinations of temperature and voltage of one embodiment of the present disclosure.

FIG. 3D illustrates an example energy storage amount lookup table 312 at predefined combinations of temperature and voltage of one embodiment of the present disclosure.

Figure 4:
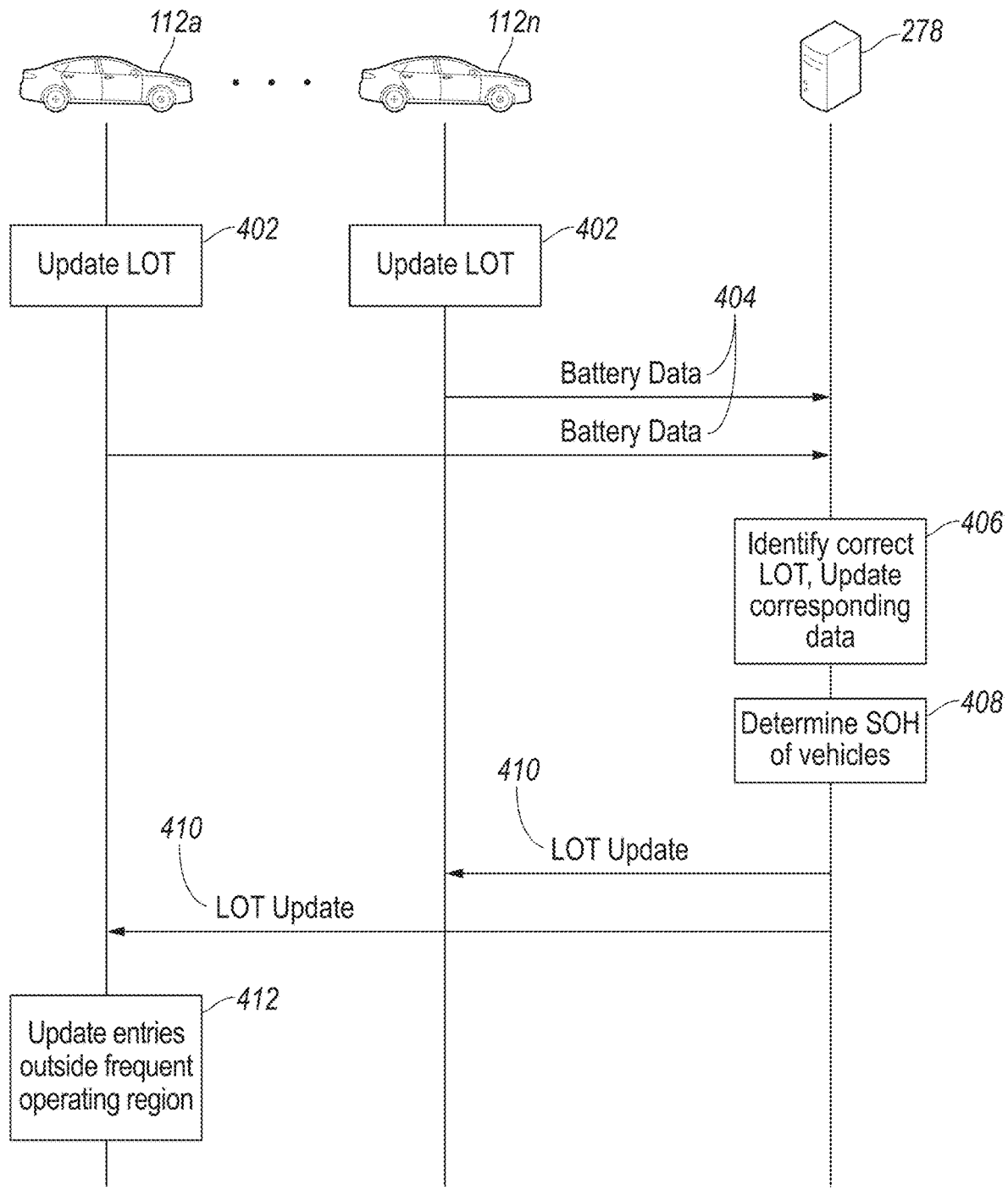
FIG. 4 is a data flow diagram of a vehicle battery health management system.

Referring to FIG. 4, an example data flow diagram of a process 400 of one embodiment of the battery health management system is illustrated. With continuing reference to FIGS. 1-3, the server 278 may be configured to communicate with a plurality of vehicles 112 that are provided hardware and software to perform the operations of the present disclosure. For simplicity purposes, only two vehicles 102a and 102n are illustrated and it should be noted that the present disclosure is not limited thereto. At operation 402 one or more vehicles 112 updates a lookup table (e.g. the MPC table 300 and/or the MESC table 302) responsive to detecting a battery parameter change as the vehicle 112 is being used and the battery 124 ages. The updates to the lookup table may be limited to the frequent operating region 304 for each respective vehicle 112. At operation 404, the vehicles 112 send the battery data 282 to the server 278 to report the updates. The battery data 282 sent to the server 278 may include various information related to the condition of the battery 124. As a few non-limiting examples, the battery data 282 may include the updated MPC entry, the updated MESC entry, and parameters reflecting the condition under which the entries were updated such as the SOH, temperature, SOC, battery internal resistance, capacitance or the like. The battery data 282 may further include information identifying the frequent operating region 304 of each respective vehicle. The frequent operating region 304 may be identified or determined in various ways. As an example, a data entry may be classified within the frequent operating region 304 if the entry is updated for more than a predefined threshold (e.g. 5 time) during a past period (e.g. past month). In an alternative example, at operation 402, the BECM 125 may also estimate and update data entries outside the frequent operating region of each lookup table responsive to the battery aging. In this case, the entire updated lookup table may be sent to the server 278 as a part of the battery data 282 at operation 404.

At operation 406, responsive to receiving the battery data 282 from the one or more vehicles 112, the server 278 processes and records the data by identifying one or more corresponding lookup tables and locations of the corresponding data update. The vehicles 112 may be associated with different models of traction batteries depending on the vehicle configuration (e.g. different number of battery cells). Even for the same battery model, the updated battery data 282 may correspond to different SOHs, SOCs, and temperatures. The server 278 may be configured to determine the collective lookup table index and location of the data based on a rule-based classification algorithm and/or artificial intelligence. Responsive to successfully identifying and locating the lookup table that the battery data 282 corresponds to, the server 278 may record the battery data 282 and update the collective lookup table. There are many ways in which the collective lookup table may be updated. For instance, the server 278 may replace an existing data entry with the updated data 282 as received. The server 278 may alternatively calculate an average value for the data entries using the battery data 282 received from a plurality of vehicles 112. Alternatively, the server 278 may assign a weight to the battery data 282 based on the operating condition of battery 124. Battery data updates for entries located within the frequent operating region 304 may be given more weight than updates for entries outside the frequent operating region 304.

The server 278 may be further configured to share one or more updated collective lookup tables to one or more vehicles 112. At operation 408, the server 278 determines a correct lookup table to send to each vehicle 112 by verifying the current SOH of each vehicle 112. Responsive to determining the current SOH, the server 278 sends corresponding lookup table updates to each vehicle 112 at operation 410. Additionally or alternatively, the server 278 may send lookup tables corresponding to an anticipated SOH to the respective vehicles. For instance, for the vehicle 112a having a current SOH of 87%, the server 278 may send lookup tables corresponding to 85-86% SOH in the update as the current SOH is approaching the anticipated SOH. The lookup table updates may include the entire lookup table corresponding to the current SOH of the vehicle. Responsive to receiving the updates, the BECM 125 of the respective vehicle 112 updates data entries of the lookup table accordingly at operation 412. For instance, the BECM 125 may be configured to only update data entries outside the frequent operating region 304 of the respective lookup table. In an alternative example, the lookup table updates sent at operation 410 may only include entries outside the frequent operating region 304 of the respective vehicle. In this case, the BECM 125 may directly update the corresponding data entries without having to further identify the data updates received.

Figure 5:
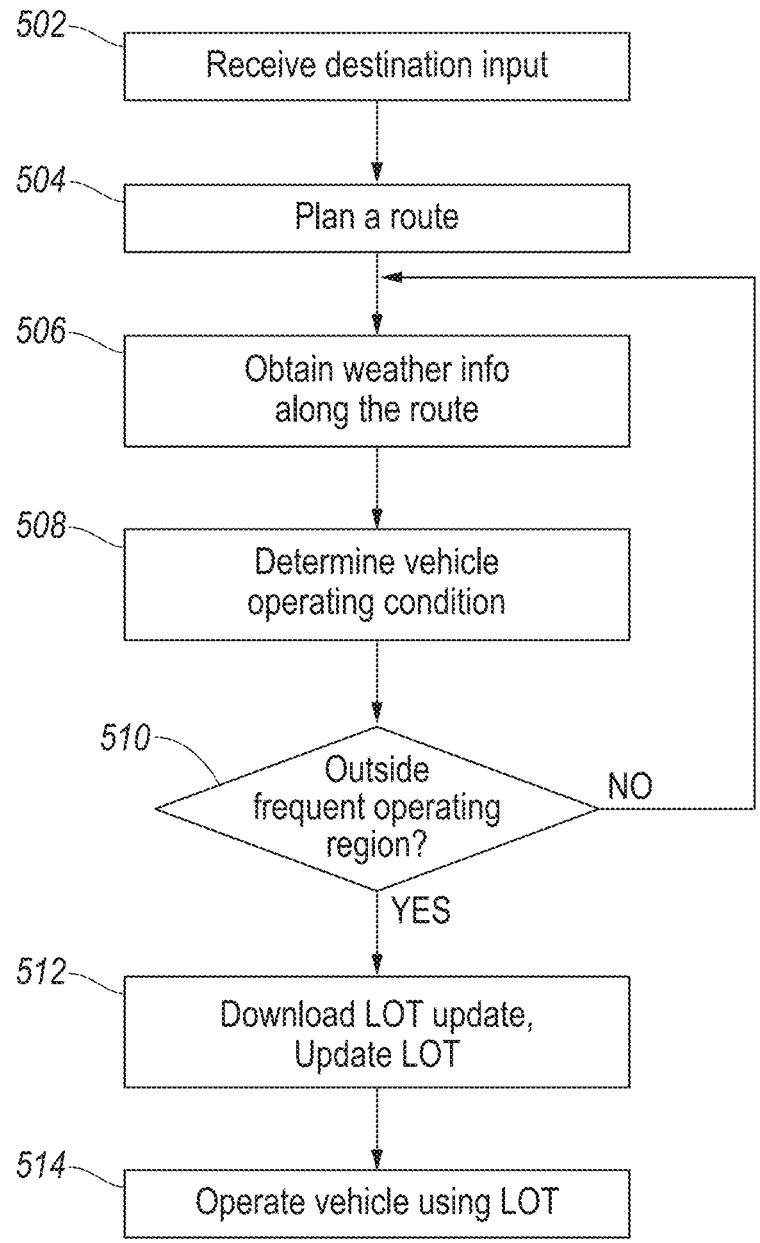
FIG. 5 is a flow diagram for a vehicle lookup table update process.

Referring to FIG. 5, an example flow diagram for a vehicle lookup table update process 500 is illustrated. With continuing reference to FIGS. 1-4, the process 500 may be implemented via the computing platform 148 of the vehicle 102a. Additionally or alternatively, the process 500 may be implemented by other components of the vehicle 112a in addition to or in lieu of the computing platform 148. At operation 502, the computing platform 148 receives a navigation destination input indicative of planned trip for a vehicle user. The navigation destination may be input via the HMI controls 212 of the computing platform 148. Alternatively, the navigation destination may be received by the computing platform 148 from the mobile device 228 in communication with the computing platform 148 via the wireless connection 230. Alternatively, the navigation destination may be a location of a calendar event stored in the mobile device 228 as a part of the mobile data 262 and or stored in the storage 210 as a part of the vehicle data 226. In response, the computing platform 148 plans a route to the navigation destination via the navigation controller 222. The navigation route may further include one or more planned stops for charging. In an alternative example, the navigation route may be planned by the mobile device 228 and sent to the computing platform 148. In either case, responsive to determining the navigation route, at operation 506, the computing platform 148 obtains weather information for the navigation route from a cloud server 278. The weather information may include temperature, weather, or the like. At operation 508, the computing platform 148 determines the vehicle operating conditions along the navigation route based on the route and weather information. For instance, the vehicle operating conditions may include an estimated SOC and battery temperature at a given part on the navigation route such that computing platform 148 may determine if the operating condition is outside the frequent operating region 304 of one or more lookup tables. The computing platform 148 may further use the weather information to predict a vehicle utility usage to more accurately predict the battery discharge power and a vehicle range. For instance, vehicle air-conditioner usage is more likely in hot temperatures. The computing platform 148 may take such a usage into account while estimating the vehicle range and anticipated SOC at a given location. At operation 510, if the computing platform 148 determines the planned operation condition is outside one or more frequent operating region 304, the process proceeds to operation 512 to download a lookup table update from the server 278. The computing platform 148 may send a request to the server 278 to request the updated lookup table corresponding to the configuration of the vehicle 112a. Alternatively, the request may include information about the estimated operating condition such that only data entries corresponding to the estimated operating condition may be downloaded. Responsive to successfully downloading the update, the BECM 125 updates the one or more lookup tables. At operation 514, the computing platform 148 operates the vehicle using the lookup table as updated.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure.

As previously described, the features of various embodiments can be combined to form further embodiments that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to, strength, durability, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A battery system of a vehicle comprising:
   a battery;
   a storage configured to maintain data defining power outputs for the battery at a plurality of predefined combinations of temperature and state of charge; and
   one or more controllers programmed to,
      repeatedly update the data for some of the plurality based on temperatures and states of charge repeatedly encountered by the vehicle,
      update the data for other of the plurality based on data from a remote server that was generated by other vehicles after the other vehicles repeatedly encountered the predefined combinations of temperature and state of charge corresponding to the other of the plurality, and
      discharge the battery according to the data for the some and other of the plurality.

2. The battery system of claim 1, wherein the one or more controllers are further programmed to update the data responsive to identifying a navigation route and anticipated combinations of temperature and state of charge corresponding to the other of the plurality.

3. The battery system of claim 1, wherein the storage is further configured to maintain second data defining energy storage amounts for the battery at the plurality of predefined combinations of temperature and state of charge.

4. The battery system of claim 3, wherein the one or more controllers are further programmed,
repeatedly update the second data for the some of the plurality based on the temperatures and states of charge repeatedly encountered by the vehicle,
update the second data for the other of the plurality based on data from the remote server that was generated by the other vehicles after the other vehicles repeatedly encountered the predefined combinations of temperature and state of charge corresponding to the other of the plurality, and
discharge the battery according to the second data for the some and other of the plurality.

5. The battery system of claim 1, wherein the one or more controllers are further programmed to send the data for the some of the plurality to the remote server.

6. The battery system of claim 1, wherein the one or more controllers are further programmed to send the data for the some and other of the plurality to the remote server with an identifier that distinguishes the some from the other of the plurality.

7. A method comprising:
maintaining data defining energy storage amounts for a battery of a vehicle at a plurality of predefined combinations of temperature and voltage;
repeatedly updating the data for some of the plurality based on temperatures and voltages repeatedly encountered by the vehicle;
updating the data for other of the plurality based on data from a remote server that was generated by other vehicles; and
operating the battery according to the data for the some and other of the plurality.

8. The method of claim 7, further comprising:
updating the data responsive to identifying a navigation route and anticipated combinations of temperature and voltage corresponding to the other of the plurality.

9. The method of claim 7, further comprising:
maintaining second data defining power outputs for the battery at the plurality of predefined combinations of temperature and voltage.

10. The method of claim 9, further comprising:
repeatedly updating the second data for the some of the plurality based on the temperatures and voltages repeatedly encountered by the vehicle;
updating the second data for the other of the plurality based on data from the remote server that was generated by other vehicles; and
discharging the battery according to the second data for the some and other of the plurality.

11. The method of claim 7, further comprising:
sending the data for the some of the plurality to the remote server.

12. The method of claim 7, further comprising:
sending the data for the some and other of the plurality to the remote server with an identifier that distinguishes the some from the other of the plurality.

13. A vehicle system comprising:
one or more controllers programmed to
repeatedly update data defining power outputs for a battery of a vehicle at some of a plurality of predefined combinations of temperature and voltage based on temperatures and voltages repeatedly encountered by the vehicle,
update the data for other of the plurality based on data from a remote server, and
discharge the battery according to the data for the some and other of the plurality.

14. The vehicle system of claim 13, wherein the data for the other of the plurality is generated by other vehicles after the other vehicles repeatedly encountered the predefined combinations of temperature and voltage corresponding to the other of the plurality.

15. The vehicle system of claim 13, wherein the one or more controllers are further programmed to update the data responsive to identifying a navigation route and anticipated combinations of temperature and voltage corresponding to the other of the plurality.

16. The vehicle system of claim 13, wherein the one or more controllers are further programmed,
repeatedly update the second data defining energy storage amounts for the battery at the plurality of predefined combinations of temperature and voltage for the some of the plurality based on the temperatures and voltages repeatedly encountered by the vehicle;
update the second data for other of the plurality based on data from a remote server; and
discharge the battery according to the second data for the some and other of the plurality.

17. The vehicle system of claim 13, wherein the one or more controllers are further programmed to send the data for the some of the plurality to the server.

18. The vehicle battery system of claim 13, wherein the one or more controllers are further programmed to send the data for the some and other of the plurality to the server with an identifier that distinguishes the some from the other of the plurality.

* * * * *